United States Patent [19]

Takemoto et al.

[11] Patent Number: 5,066,602
[45] Date of Patent: Nov. 19, 1991

[54] METHOD OF MAKING SEMICONDUCTOR IC INCLUDING POLAR TRANSISTORS

[75] Inventors: Toyoki Takemoto, Yawata; Tadao Komeda, Ikoma; Haruyasu Yamada; Tsutomu Fujita, both of Hirakata, all of Japan

[73] Assignee: Matsushita Electric Industrial Co., Ltd., Kadoma, Japan

[21] Appl. No.: 295,380

[22] Filed: Jan. 10, 1989

Related U.S. Application Data

[60] Division of Ser. No. 124,423, Nov. 23, 1987, Pat. No. 4,826,780, which is a division of Ser. No. 841,688, Mar. 19, 1986, abandoned, which is a continuation of Ser. No. 485,887, Apr. 18, 1983, abandoned.

[30] Foreign Application Priority Data

| Apr. 19, 1982 | [JP] | Japan | 57-65925 |
| Jun. 2, 1982 | [JP] | Japan | 57-95332 |
| Jun. 2, 1982 | [JP] | Japan | 57-95333 |
| Jun. 2, 1982 | [JP] | Japan | 57-95334 |
| Jun. 2, 1982 | [JP] | Japan | 57-95345 |
| Sep. 9, 1982 | [JP] | Japan | 57-157623 |
| Jan. 31, 1983 | [JP] | Japan | 58-14896 |

[51] Int. Cl.[5] ........................... H01L 21/331
[52] U.S. Cl. ........................... 437/31; 437/55; 437/56; 437/32; 437/918; 148/DIG. 9; 148/DIG. 151
[58] Field of Search ............ 437/55, 56, 57, 31, 437/32, 33, 34, 918; 148/DIG. 9, DIG. 87, DIG. 151; 357/43

[56] References Cited

U.S. PATENT DOCUMENTS

| 3,576,475 | 4/1971 | Kronlage | 437/56 |
| 3,638,079 | 1/1972 | Chan | 437/55 |
| 3,702,428 | 11/1972 | Schmitz et al. | 437/55 |
| 3,865,649 | 2/1975 | Beasom | 437/56 |
| 3,956,035 | 5/1976 | Herrmann | 437/55 |
| 4,087,900 | 5/1978 | Yiannoulos | 437/55 |
| 4,120,707 | 10/1978 | Beasom | 437/31 |
| 4,403,395 | 9/1983 | Curran | 437/41 |
| 4,404,738 | 9/1983 | Sasaki et al. | 437/55 |
| 4,546,539 | 10/1985 | Beasom | 437/31 |
| 4,826,780 | 5/1989 | Takemoto et al. | 437/37 |

FOREIGN PATENT DOCUMENTS

| 53-66187 | 6/1978 | Japan | 437/55 |
| 54-34784 | 3/1979 | Japan | 437/55 |
| 56-142661 | 11/1981 | Japan | 437/55 |
| 57-164560 | 9/1982 | Japan | 437/55 |

Primary Examiner—Brian E. Hearn
Assistant Examiner—T. N. Quach
Attorney, Agent, or Firm—Cushman, Darby & Cushman

[57] ABSTRACT

In a semiconductor IC, a vertical pnp or npn transistor of a uniform characteristic and a high breakdown voltage is made by forming, for example, a $p^-$-collector region (39) in an n-type epitaxial region, an n-well base region (41) formed in the $p^-$-collector region (39) and a p-emitter region (42) formed in the n-well base region (41); and furthermore, for example as shown in FIG. 9, $p^-$-regions (40) and (49) are formed simultaneously with the $p^-$-collector region (39) and an n-region (53) is formed simultaneously with the n-well base region (41), thereby constituting IIL of superior characteristics and a high resistance device at the same time as forming of the vertical transistor without substantial increase of manufacturing steps; and in the similar way, by combining the $p^-$-region and n-region formed in the abovementioned simultaneous steps with other region formed simultaneously with the forming of the vertical transistor, high $h_{FE}$ transistor, high speed vertical npn transistor, cross-over devices, p-channel and/or n-channel MOS transistors can be formed within limited manufacturing steps.

6 Claims, 11 Drawing Sheets

METHOD OF MAKING SEMICONDUCTOR IC INCLUDING POLAR TRANSISTORS

This is a division of application Ser. No. 07/124,423, filed Nov. 23, 1987, now U.S. Pat. No. 4,826,780, which is a division of Ser. No. 06/841,688, filed Mar. 19, 1986, abandoned, which is a continuation of Ser. No. 06/485,887, filed Apr. 18, 1983, abandoned.

BACKGROUND OF THE INVENTION

1. Field of the Invention

The present invention relates to a semiconductor IC.

The present invention particularly concerns a semiconductor IC including high speed bipolar transistors.

2. Description of the Prior Art

A semiconductor IC generally comprises transistors and npn transistors in a monolithic construction. The npn transistors generally have high switching speed, while the pnp transistors are not suitable for high speed switching since they have been previously vertical structure and implemented in a more complex construction than the npn transistors. Accordingly, in a semiconductor IC including both the pnp transistors and npn transistors, full high speed performance of the npn transistors cannot be achieved due to imbalance between the two types of transistors and the circuit design also has many limitations.

FIG. 1 shows a sectional configuration of a prior art semiconductor IC including pnp transistors and npn transistors in a monolithic configuration.

In FIG. 1 numeral 1 designates a p-type substrate, numeral 2 designates high concentration n-type buried region, numeral 3 designates an n-type epitaxial layer, numeral 4 designates a diffused isolation region, numeral 5 designates a diffused isolation region formed from the surface of the epitaxial layer 3 and which is connected with the isolation diffused region 4 to serve as the isolation between the active regions.

P-type diffused regions 6e, 6c and 7b are formed simultaneously. The p-type region 7b is a base region of an npn transistor part, and p-type regions 6e and 6c are the emitter region and collector region of the lateral pnp transistor part. High impurity concentration n+-type region 8b, 9e and 9c are base contact regions for the lateral pnp transistor, emitter region of the vertical npn transistor and collector contact region of the vertical npn transistor, respectively. In the vertical npn transistor and lateral pnp transistor formed monolithically as shown in FIG. 1, achievable minimum base width (distance between the p-type region 6e and p-type region 6c) is determined by the accuracy of the plan view pattern, namely accuracy of the mask pattern used for a lithographic method. In general, the mask accuracy is not so high, and accordingly the achievable minimum base width has been about 3 μm. Therefore, it has been impossible to manufacture highly integrated pnp transistors on the bipolar IC. On the other hand in the npn transistor part, the base region 7b has graded impurity concentration with respect to depth, accordingly a graded electric field is formed in the base region 7b, thereby carriers are accelerated to achieve high speed performance. However, in the lateral pnp transistor part, no graded concentration is formed in the base region 3 which is the epitaxial layer as such, therefore the above-mentioned carrier acceleration by means of graded concentration is impossible. Furthermore, the collector region 6c of the pnp transistor has rather higher concentration than that of the base region 3, accordingly when the base width is shortened a collector-base breakdown voltage is very much lowered.

As has been elucidated, the prior art IC having a lateral pnp transistor and vertical npn transistor on a monolithic chip has such shortcomings that achievable minimum base width is not sufficiently short, therefore there is no graded impurity concentration profile. Hence no graded electric field is produced and concentrations of the emitter region and collector region of the lateral pnp transistor have to be equal to each other. Therefore, as a result of these reasons, the lateral pnp transistor part generally has very poor characteristics in comparison with the vertical npn transistor part. Accordingly the semiconductor IC as shown in FIG. 1, as a whole, cannot achieve satisfactory characteristics.

In order to improve the above-mentioned drawback of the semiconductor IC of FIG. 1, another improvement has been proposed as shown in FIG. 2. The semiconductor IC shown in FIG. 2 is characterized by a vertical pnp transistor part. In FIG. 2, numeral 11 designates a p-type substrate, numeral 12 designates a high concentration n-type buried region, numeral 13 designates an n-type epitaxial layer, numeral 14 designates a diffused p+-type isolation region, and numeral 15 designates a p+-type diffused isolation region. Two isolation regions 14 and 15 together form an isolation region to surround the active region. Numeral 16 designates a p+-type region formed on an n+-type buried region 12, and the p+-type region 16 forms a collector region of this vertical pnp transistor part. The n-type epitaxial layer 13 forms a base region. The numerals 17 and 18 are p+-type regions formed simultaneously with forming of the p+-type regions 14 and 15, respectively, and the p+-type regions 17 and 18 form lead out regions for the collector region 16. Numerals 19, 19 designate walls. Numeral 20 designates a p+-type diffused region which is formed simultaneously with the isolation regions 15 and serves as a emitter region of the vertical pnp transistor part.

In the npn transistor part, n+-type region 21 is the emitter region, p-type diffused region 22 is the base region, and n+-type diffused region 19' together with n+ region 23 form a collector contact.

In the configuration of FIG. 2, a vertical pnp transistor is formed with a p+-type diffused region as emitter, n-type epitaxial layer 13 to be led out by n+-region 19 as the base, and p+-type buried region 16 as the collector. Apart from the lateral pnp transistor as shown in FIG. 1, this vertical pnp transistor has a base width which is determined by the vertical width of the n-type region 13 between the p+-type diffused region 20 and the p+-type buried region 16. And the base width is dependent on the depth of the p+-type diffused region 16, thickness of the n-type epitaxial layer 13 and diffusion depth of the p+-type diffused region 20, and not determined by the mask size or accuracy of the mask. Accordingly, the base width can be made very narrow. However, this configuration has several shortcomings. Firstly, the base width which is determined by the above-mentioned three sizes, depends on parameters of the three diffusions and therefore, accurate control is very difficult. Secondly, since the impurity concentration of the p+-type diffusion region 16 is determined as a difference between the impurities of n+-type buried region 12 and the p+-type impurity to be diffused in the region 16, the upward diffusion of the p+-type region 16 is determined not only by the doping value of the p+-type impurity and, therefore, it is difficult to control the upper surface of the p+-type region 16. Therefore, the base width accuracy is difficult to achieve. Thirdly, this configuration can not provide graded impurity concentration in the base region, and also the impurity concentration of the collector region 16 is still high. Thus the configuration of the prior art of FIG. 2 has not been satisfactory.

FIG. 3 shows another prior art configuration wherein a vertical pnp transistor and a vertical npn transistor are formed in combination, wherein corresponding parts to the parts in the prior art example FIG. 2 are shown by the same reference numerals. In the prior art of FIG. 3, n+-region 24 connected to buried n+-region 12 and n+-region 24 is the emitter lead out region for IIL npn transistor. The IIL npn transistors are formed with n+-type diffused regions 27-1 and 27-2 as collectors, p-type diffused region 26 as base regions and n-type epitaxial region 13 as emitter regions which are led out through the buried n+-region 12 and diffused n+-region 24. An IIL pnp transistor is formed by a p-type diffused region 25 as emitter (injector), n-type epitaxial region 13 as base region, and the p-type diffused region 26 as the collector. The p-type regions 25 and 26 are formed in a step corresponding to forming of a base region 22 of the npn transistor in FIG. 2. The n+-type collector regions 27-1 and 27-2 are formed in a step corresponding to forming of the emitter region 21 in the case of FIG. 2.

In the IIL as shown in FIG. 3, since the emitter contact region 24 contacts low impurity concentration epitaxial layer 13, a large number of holes as minority carriers are injected from the base region 26 to the emitter region 13. As a result, the current amplification factor of the vertical npn transistors is not high, and the speed of the IIL becomes slow. If impurity concentration of the epitaxial layer 13 is raised, it will result in lowering its breakdown voltage of the vertical npn transistor.

As has been elucidated with reference to FIG. 2 which has a vertical pnp transistor and a vertical npn transistor and FIG. 3 which has IIL, fulfilling of high speed and high breakdown voltage at the same time in the prior art configuration has been difficult.

FIG. 4 shows still another prior art example of a bipolar transistor combined with CMOS transistor. In FIG. 4, parts corresponding to the preceding prior art examples are designated with corresponding reference numerals the p-well region 14a+15a are formed simultaneously with forming of the diffused isolation regions 14 and diffused region 15, respectively. Thereafter, source region 28 and drain region 28' of a p-channel MOS FET are formed simultaneously with forming of base region 22 of vertical npn transistor 22. And source region 29 and drain region 29' of an n-channel MOS FET are formed simultaneously with forming of the emitter region 21 of the vertical transistor. Gate oxide films 30-1 and gate electrodes 30-2 are formed.

In the above-mentioned prior art IC, diffusion depths of the source region 28 and drain region 28' are the same as that of the base region 22 of the vertical npn transistor. Therefore the diffusion depth is too deep for the source region 28 or drain region 28'. Accordingly, effective channel distance 1 becomes too short, thereby source-drain breakdown voltage is liable to be lowered, or the threshold value ($V_T$) lowered as a result of short-channel effect. Alternatively, in order to prevent the above-mentioned short-channel effect, resistivity of the epitaxial layer 13 may be lowered, but such lowering of the resistance of the epitaxial layer 13 will produce a problem that emitter-collector breakdown voltage of the vertical npn transistor is lowered.

SUMMARY OF THE INVENTION

The present invention has as its object to provide an improved semiconductor IC including a high speed bipolar transistor. More particularly, the present invention has as its object to provide an improved IC wherein shortcomings of low speed of conventional lateral pnp bipolar transistor and controllability in manufacture of characteristics of vertical type pnp bipolar transistors are improved.

A semiconductor IC in accordance with the present invention comprises:

a semiconductor substrate of a first conductivity type, a semiconductor layer formed on the substrate and of second conductivity type which is opposite to the first conductivity type, a first buried region of the second conductivity type buried between the semiconductor substrate and the semiconductor layer, a second buried region of the first conductivity type buried on the first buried region, a collector region of a vertical transistor of the first conductivity type of a low impurity concentration formed to extend from the surface of the semiconductor layer to the second buried region, a base region of the vertical transistor of the second conductivity type formed in the collector region from the surface thereof, and an emitter region of the vertical transistor of the first conductivity type formed in the base region from the surface thereof.

The vertical transistor in the IC is intended as a high speed transistor.

Further, the present invention can provide an IIL having regions formed simultaneously with a first conductivity type low impurity concentrations (for instance, p−) collector region and an opposite conductivity type base region of said vertical transistor, thereby having improved characteristics.

Furthermore, the present invention can provide a semiconductor IC having either conductivity type vertical transistors with high $h_{FE}$ value or high speed by forming a collector region of a conductivity type of a vertical transistor and other vertical transistors having regions formed simultaneously with the collector region and base region of said vertical transistor. High resistance devices and cross-over devices, are formed very easily on a monolithic wafer.

Furthermore, the present invention can provide a method of making a semiconductor enabling simultaneous forming of a well for a n-channel MOS transistor and a collector region of a pnp transistor, or a well for a p-channel MOS transistor and a base region of a pnp transistor, or source region and drain region of a p-channel MOS transistor and emitter region of a pnp transistor, or source region and drain region of n-channel transistor and emitter region of an npn transistor, each in the same step.

DESCRIPTION OF THE PREFERRED EMBODIMENTS

Figure 5:
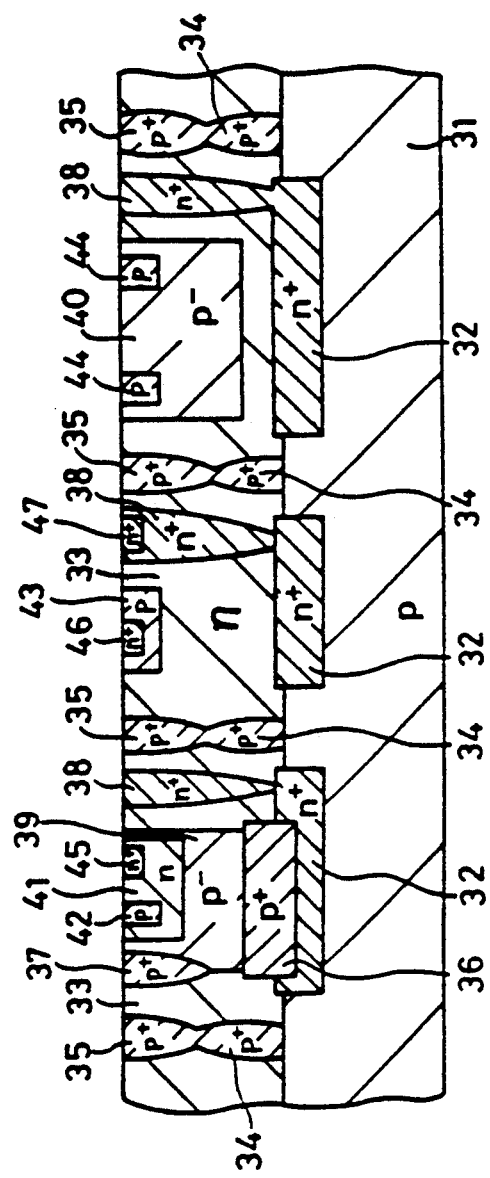
FIG. 5 is a sectional elevation view showing a semiconductor IC embodying the present invention wherein a vertical pnp transistor and a lateral npn transistor and a high resistance resistor are integrally formed on a wafer.

The present invention is elucidated in detail with reference to the accompanying drawings of FIG. 5 and thereafter.

FIG. 5 is a sectional elevation view of a first example of a semiconductor IC embodying the present invention.

In this example, a vertical pnp transistor, a vertical npn transistor and a high resistance resistor are formed monolithically on one wafer, wherein the part of the vertical pnp transistor is improved. In the example of FIG. 5, on a p-type semiconductor substrate 31, n+-type high impurity concentration buried regions 32, 32 and 32 are formed. On the substrate 31, an n-type epitaxial layer 33 of about 0.5–1.0 Ωcm, 3–4 μm thickness is formed. In the epitaxial layer 33, high impurity concentration p+-type diffused regions 34, 34, 34 and 34 are formed; and from the surface of the epitaxial layer 33 additional p+-type high impurity concentration regions 35, 35, 35 and 35 are formed, thereby to connect with the above-mentioned high impurity concentration p+-type diffused regions 34, 34, 34 and 34 and isolate the epitaxial layer into several regions. Alternatively, the isolation may be made by using a known oxide film. A second buried region 36 of high impurity concentration p+-conductivity type is formed on one of the n+-type buried region 32, at the same time as forming of the isolation region 35. However, the surface concentration of the high impurity concentration region 36 is not so high as compared with that of the diffused isolation region 34, since the impurity concentration in the second buried region 36 is considerably off-set by n+-type impurity in the first buried region 32. A p+-type diffused region 37 is formed at the same time as forming of the diffused region 35 in order to decrease collector resistance of the vertical PNP transistor.

An n+-type diffused region 38 form a collector wall and connects to n+-type buried region 32, and a p−-type region 39 is formed by low-dosing of ion implantation, so that its sheet resistance is about 2 kΩ/□–4 kΩ/□ which is lower by one digit from that of the ordinary base region of 200 Ω/□.

A low concentration diffused region 40 is formed at the same time as forming of p−-type diffused region 39, and serves as a high resistance device. The vertical pnp transistor has an n-type well region 41 which is formed in the p−-type collector region 39 and serves as the base region of the vertical pnp transistor. A p-type region 42 has a sheet resistance of about 200 Ω/□ and serves as the emitter region of the vertical pnp transistor, and the p-type region 42 is formed at the same time as a p-type base region 43 of a vertical npn transistor. P-type diffused region 44 and 44 serve as the contact regions of the high resistance device and are formed at the same time as forming the emitter region 42 and the base region 43. An n+-type diffused region 45 is formed in the n-type diffused region 41 and serves as a contact region for the base region, and is formed at the same time as the emitter region 46 of the npn transistor. An n+-type diffused region 47 is formed in the collector wall region 38 to lead out the collector region 33 of the vertical npn transistor.

Figure 1:
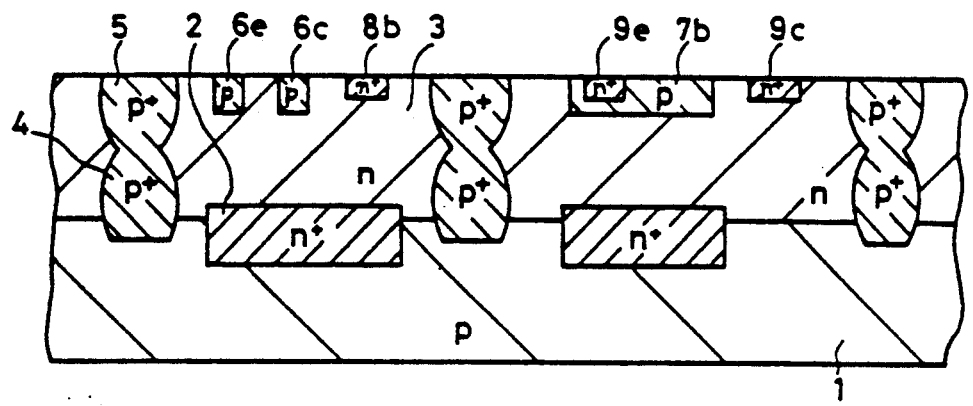
FIG. 1 and FIG. 2 are the sectional elevation views of a prior art semiconductor IC.
Figure 2:
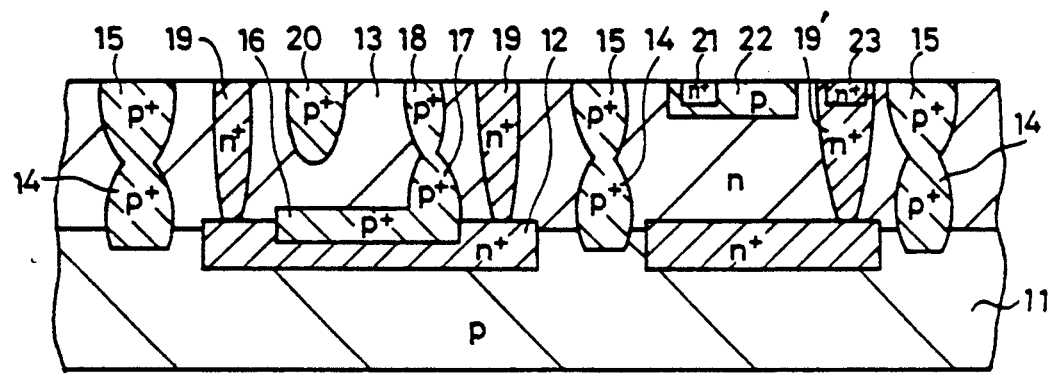
Figure 3:
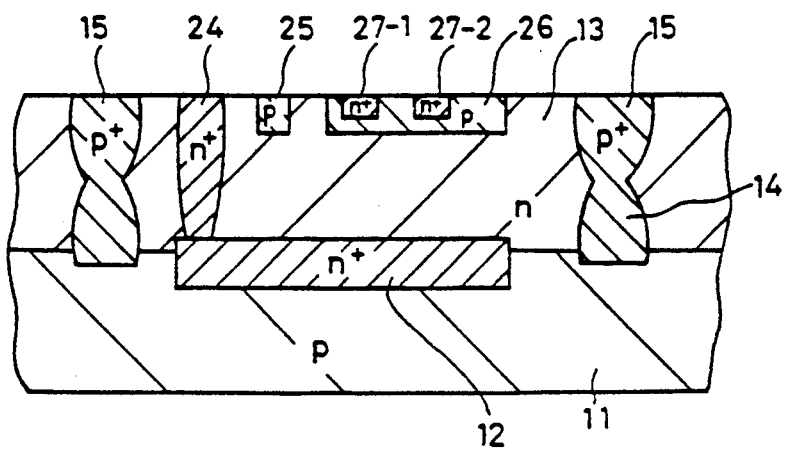
FIG. 3 is the sectional elevation view of the prior art IIL of semiconductor IC.
Figure 4:
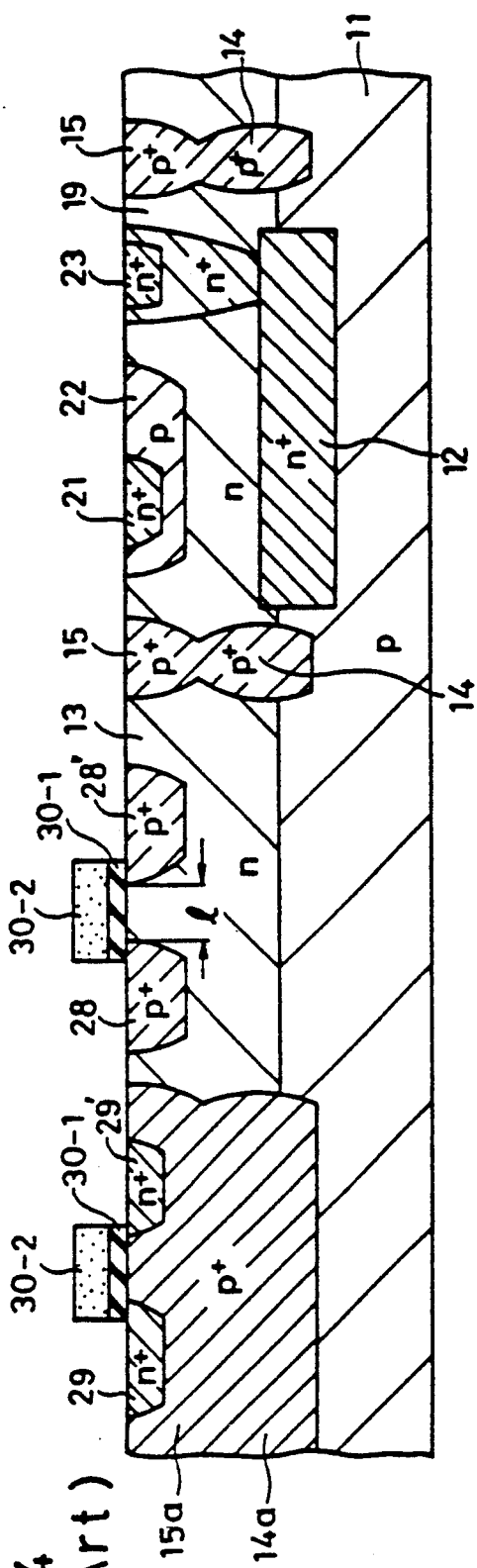
FIG. 4 is the sectional elevation view of a prior art MOS transistor of a semiconductor IC.

As is obvious from the above-mentioned configuration of FIG. 5, a vertical pnp transistor is formed with the emitter region 42, the base region 41 and the collector region 39+36. And the vertical npn transistor is formed with the emitter region 46, the base region 43 and the collector region 33+32, and a high resistance device is formed with a p−-type part 40 and contact regions 44. In the vertical pnp transistor at the left, its base width is accurately defined by accurate controlling of concentration and depth of the n-type base region 41 by means of ion implantation. Accordingly, the base width (width in vertical direction) is determined by diffusions of the n-type region 41 and p-type region 42 only. That is to say, in contradistinction to the prior art configuration of FIG. 2 where the base width is determined by three parameters, in the configuration of the FIG. 5 example the base width is determined only by two parameters. Furthermore, since the n-type base region 41 is determined only by drive-in after the ion implantation, the base region 41 has an impurity concentration graded high at the surface and low downwards. Accordingly, carriers are accelerated by an electric field, thereby increasing carrier mobility speed, hence enabling high speed operation. Furthermore, since the collector region 39 has p−-type conductivity, breakdown voltage thereof is sufficiently high.

As has been elucidated, the example in accordance with the present invention is very much advantageous in monolithic configuration of an IC with high breakdown voltage and high speed, with high density vertical pnp transistor, high speed vertical npn transistor and high resistance device in one chip.

Figure 6:
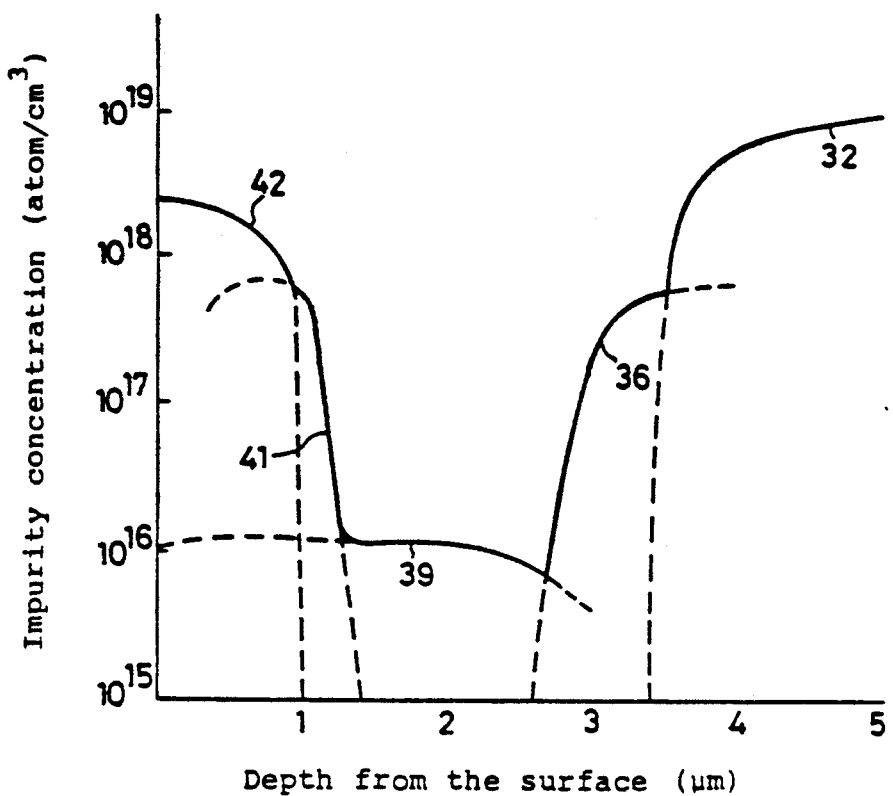
FIG. 6 is a graph showing the impurity concentration profile of the example of FIG. 5.

An impurity concentration profile of a vertical pnp transistor in accordance with the present invention is shown in FIG. 6. As shown in FIG. 6, the n+-buried region 32 is formed to have the impurity concentration as shown in the curve 32 by diffusing an impurity source having a small diffusion coefficient such as As, and the p+-type buried region 36 is formed by diffusing boron to have the profile as shown by curve 36. The p+-emitter region 42 and n base region 41 and p−-collector region 39 are formed by ion implantations of boron, phosphor and boron, respectively, followed by thermal treatment. As is obvious from the graph, the base region 41 has a large concentration gradient, and therefore a considerable electric field is produced thereacross. Since the collector region 39 has a very low impurity concentration, depth of the base region 41 is determined only by the impurity amount to form the base region and the impurity amount to form emitter region 42, and not influenced by the impurity amount of the collector region 39 itself. Furthermore, in the configuration of the example, the high resistance device 40 and collector region 39 of the vertical pnp transistor are formed in common steps, and also, the base region 43 of the vertical npn transistor and emitter region 42 of the vertical pnp transistor and contact region 44 of the high resistance device are formed in common steps, accordingly the vertical pnp transistor can be formed only by adding a step of forming n-type base region 41 of the vertical pnp transistor as an additional step.

Figure 7:
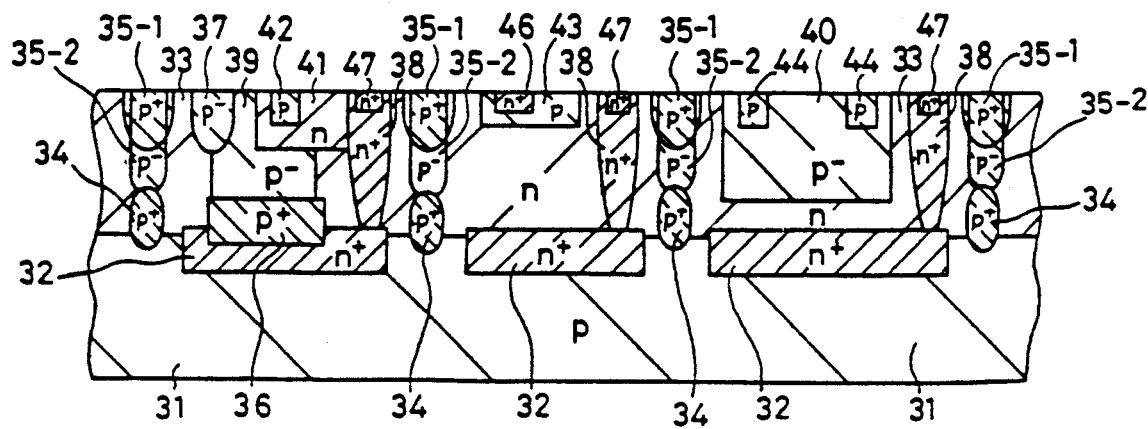
FIG. 7 is a sectional view showing a semiconductor IC embodying the present invention wherein a vertical pnp transistor is improved.

FIG. 7 is a sectional elevation view of another example embodying the present invention. The same numerals corresponding to the preceding numerals are used to designate the corresponding parts.

The configuration of the example of FIG. 7 is characterized by connecting the base region 41 of the vertical pnp transistor to the n+-type wall region 38. In this example, since the base region 41 is disposed to be connected to the wall region 38 which is disposed vertically in the n-type epitaxial region 33, resistance of the base region 41 can be decreased, thereby improving high frequency characteristics. A region 35-2 is a p−-type isolation region formed at the same time with the p−-region 41.

Figure 8:
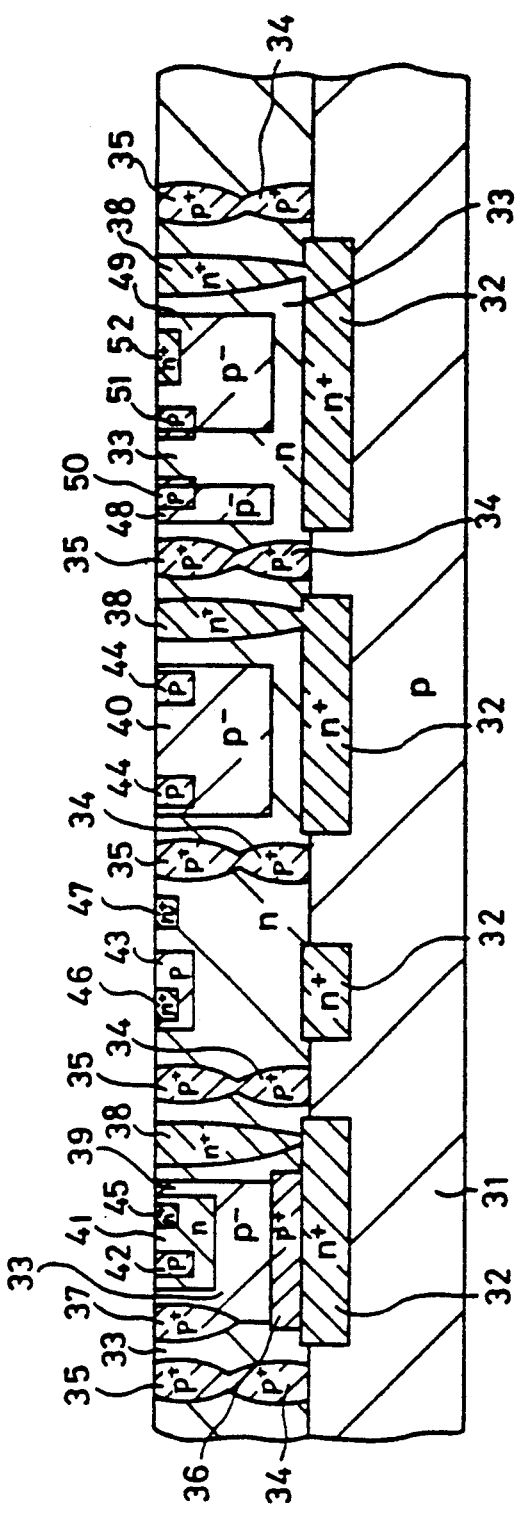
FIG. 8, FIG. 9, FIG. 10, FIG. 11 and FIG. 12 are sectional elevation views of IIL of semiconductor IC embodying the present invention.

FIG. 8 shows another example embodying the present invention, which comprises a vertical pnp transistor, a vertical npn transistor, a high resistance resistor and an IIL on a monolithic chip. In this example, the same numerals as those of FIG. 5 are used to show corresponding parts. Regions of p−-type 48 and 49 are formed in a common step with forming of the p−-regions 39 40 so as to have the same depth as them. The regions 50 and 51 of p-type are formed at the same time as those of the regions 42, 43 and 44. These p-type regions 50 and 51 are formed partly superposing on the p−-type regions 48 and 49, respectively, thereby the region 48 forms an injector of the IIL. The regions 49 and 51 together form a gate region of the IIL, and the region 49 serves as the base of the upward vertical npn transistor. An n+-type region 52 forms the collector of the upward vertical transistor.

In the IIL in accordance with the present invention, since the p−-regions 48 and 49 are formed deep, the gap between the diffusion front of the p−-region 48 and the buried region 32 and the gap between the diffusion front of the p−-region 49 and the buried region 32 can be made thin. Accordingly, the number of holes to be injected from an injector of IIL and the base of a vertical npn transistor to the epitaxial layer 33 can be made small. Therefore, storage effect due to the minority carriers becomes minimized, and accordingly the operation speed of the IIL is improved. Besides, since the base regions 49 of the vertical npn transistor are of a low impurity concentration, current amplification factor $h_{FE}$ of the vertical npn transistor can be increased.

The present example has an advantage that an IIL can be formed monolithically without changing steps of the process. And characteristics of the vertical pnp transistor at left most part is of high speed and high breakdown voltage as has been elucidated with reference to FIG. 5 and FIG. 7.

Figure 9:
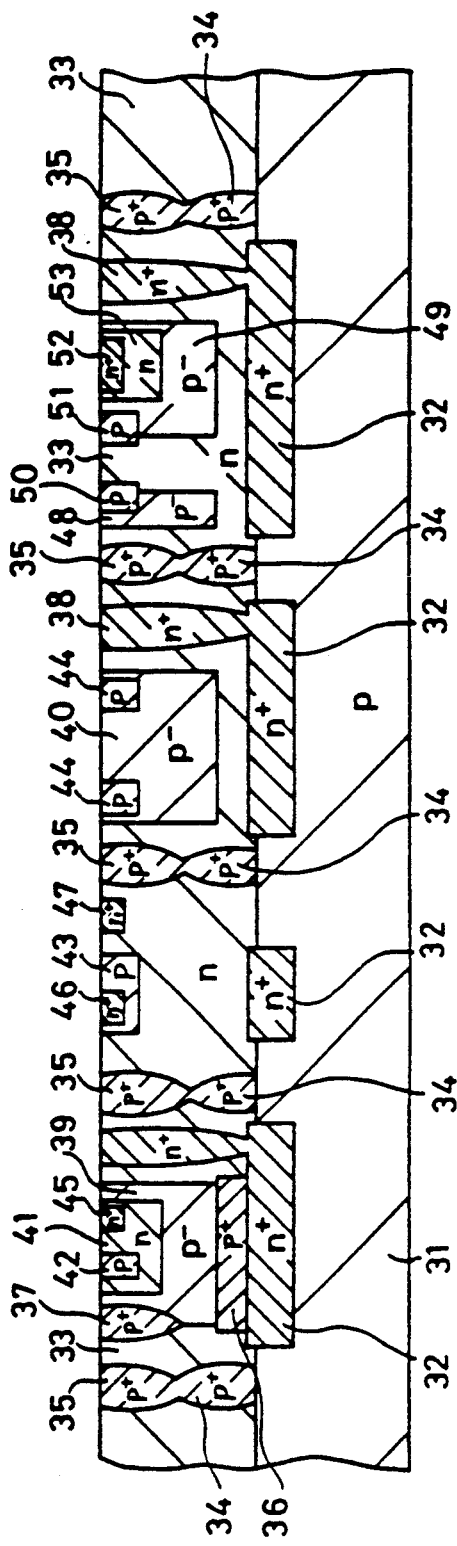

FIG. 9 is a sectional elevation view of another example.

The IC shown in FIG. 9 has an improved IIL part in comparison with the IC of FIG. 8. The same numerals as those of the preceding examples show corresponding parts. In this example, an n-type region 53 is formed to cover the n+-region 52 in the p−-region 49. This n-type region 53 is formed at the same time as the forming of the base region 41 of the vertical pnp transistor. Accordingly, no additional step is necessary in comparison with the process of FIG. 8 or FIG. 7. By means of the n-type region 53, the width (in vertical direction) of the p−-region 49 is narrowed, thereby $h_{FE}$ of the vertical npn transistor in the IIL is improved.

Figure 10:
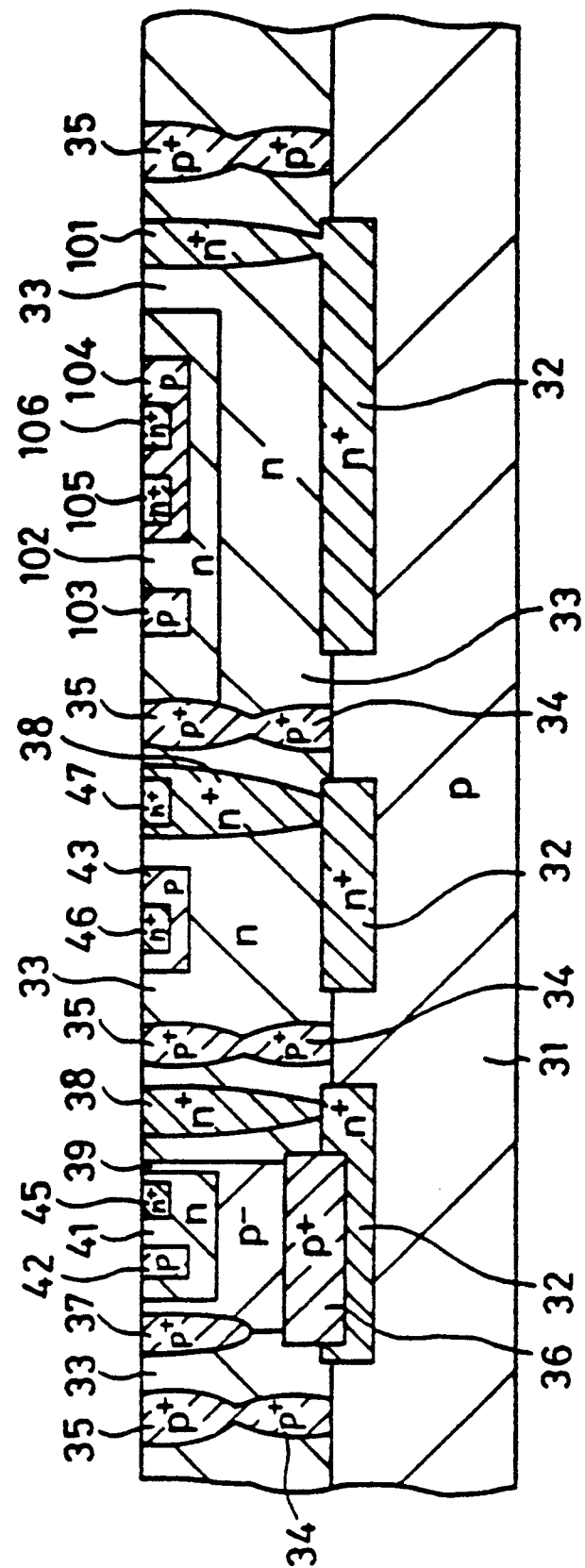

FIG. 10 is a sectional elevation of another example embodying the present invention. In this example, a vertical pnp transistor and an IIL are monolithically formed and the part of IIL is improved. Parts corresponding to those of the preceding examples especially to that of FIG. 5 are shown by the same numerals. In the IIL part, an n+-type wall region 101, which is formed at the same time as the wall regions 38, serves as the emitter contact region of the vertical npn transistor. An n-type well region 102, which is formed at the same time as forming of the base region 41 of the vertical pnp transistor, serves as a part of the base of the vertical npn transistor of IIL. Two p+-type regions 103 and 104 are formed to have specific resistance of about 200 Ω/□ and are formed at the same time as forming of the emitter region 42 of the vertical pnp transistor, and form a lateral pnp transistor together with the inbetween lying n-type region 102. The n+-type regions 105 and 106 are formed at the same time as forming of the emitter region 46 of the vertical npn transistor, and form the collector region of the vertical npn transistor of the IIL. As has been elucidated, IIL part of this example can be formed within steps of forming the vertical pnp transistor and vertical npn transistor in the left part. The IIL part comprises an n-type diffused region 102, which has higher impurity concentration than the epitaxial layer 33 in a manner to contact the base region 104 of the vertical npn transistors accordingly, number of holes as minority carriers injected from the base region 104 to the emitter region 102 can be made small. Furthermore, it is possible to make the base width of the vertical npn transistor in the IIL narrower than the conventional case where base 104 directly contacts the epitaxial layer 33. Accordingly, current amplification factor $h_{FE}$ of the npn transistor of IIL can be improved, and furthermore a higher speed performance is possible.

Figure 11:
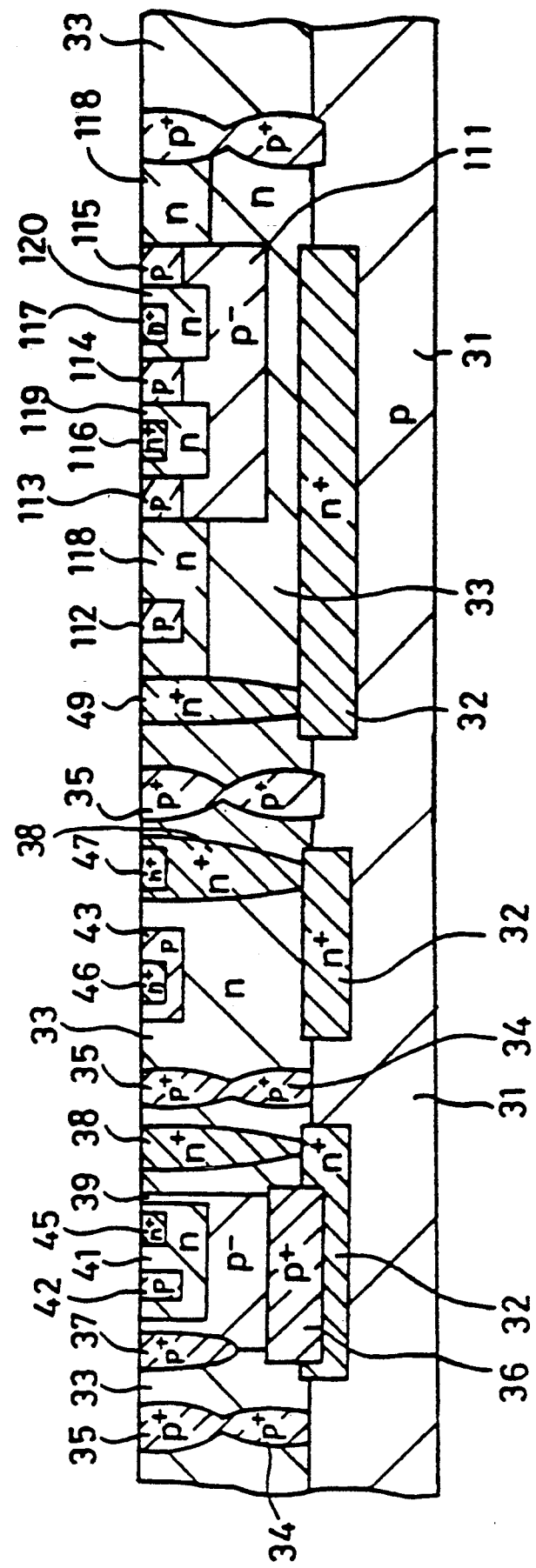

FIG. 11 is a sectional elevation view of another example embodying the present invention. The same numerals as those of the example of FIG. 10 show corresponding parts. The feature of the present example in comparison with that of FIG. 10 is that by using a low concentration p−-region 111 for base regions of the vertical npn transistor of IIL part, improvement of the current amplification factor is intended. The p−-region 111 is formed at the same time as forming of the p−-region 39 of the vertical pnp transistor in the left part. Regions of p-type 112 and 113, 114 and 115 are injector region and the base contact regions of the vertical npn transistor, respectively. These p-regions 112, 113, 114 and 115 are formed in n-type wells, 118, 119 and 120, respectively, hence do not contact n+-type regions 116 and 117 directly. An n-type well 118 is formed at the same time as the n-type base region 41 of the pnp transistor in the left part. Wells of n-type 119 and 120 form a part of collector of the npn transistor of the IIL, and serves to decrease base-collector capacitance, and to improve high speed performance. An n-well 118 serves to suppress amount of injection of holes as minority carriers by contacting the p-regions 112 and 114. By using the n-well and p-regions, characteristics of the IIL parts are thus improved.

Figure 12:
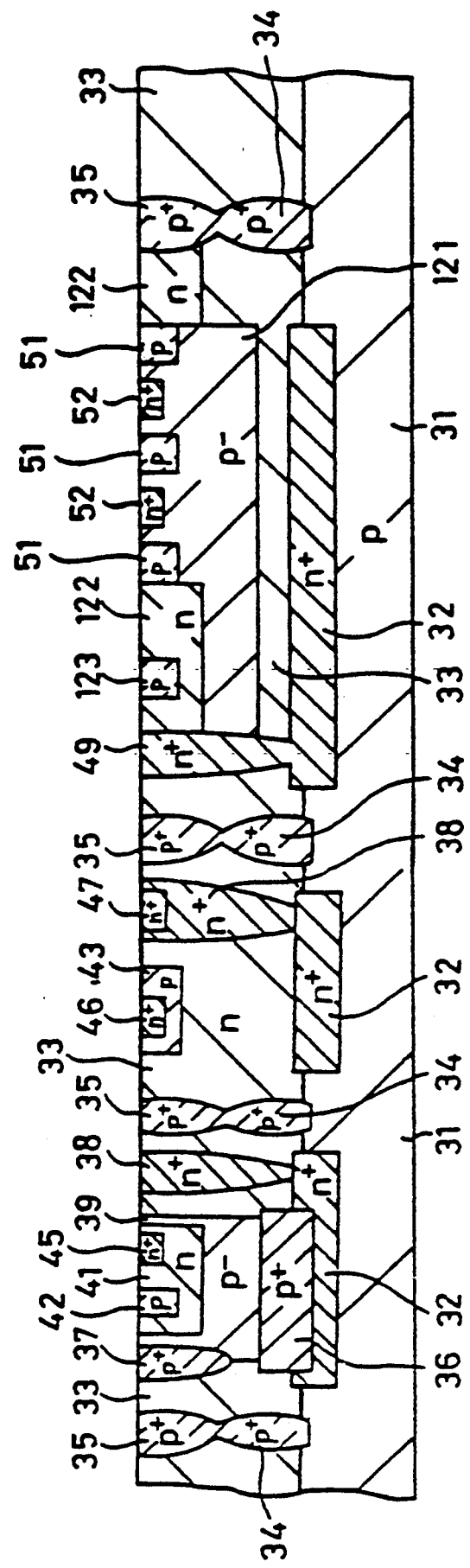

FIG. 12 is a sectional elevation view of another example embodying the present invention. The example of FIG. 12 comprises a vertical pnp transistor, a vertical npn transistor and an IIL part. The same numerals as those in FIG. 10 are used to designate the corresponding parts. The feature of the example of FIG. 12 is that a p⁻-region 121 is formed to extend to the part under the base 122 of pnp transistor of IIL and the p⁻-region 121 forms a base of npn transistor of the IIL and the collector of pnp transistor of the IIL. That is, the p+-region 123, n-region 122 and p⁻-region 121 together form a vertical pnp transistor. This vertical pnp transistor of the IIL part has better high frequency characteristics in comparison with the lateral type transistor, and the characteristics of the IIL part are also improved. Accordingly the IIL of FIG. 12 has more improved high frequency characteristics than that of FIG. 10. As elucidated above, the present invention provides an IC comprising a high speed vertical pnp transistor, high breakdown voltage vertical npn transistor and high IIL on a monolithic chip.

Figure 13:
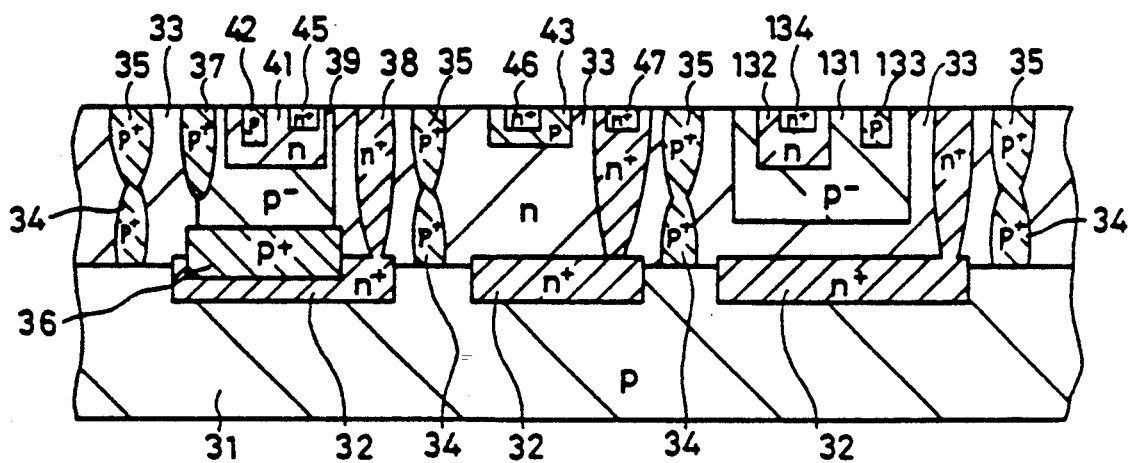
FIG. 13 is a sectional elevation view of a semiconductor IC comprising a vertical pnp transistor, a vertical npn transistor and a high $h_{FE}$ transistor monolithicly on a wafer.

FIG. 13 is a sectional elevation view of another example embodying the present invention. This example comprises a vertical pnp transistor, a vertical npn transistor and a high $h_{FE}$ npn transistor in a monolithic chip. The same numerals as those in FIG. 5 and other examples designate corresponding parts. A p⁻-well region 131 is formed at the same time as the p⁻-collector region 39 of the vertical pnp transistor at the left part, and a high $h_{FE}$ vertical npn transistor is formed utilizing this p⁻-region 131 as the base. An emitter region 132 of this high $h_{FE}$ npn transistor is formed at the same time as forming of the base region 41 of the vertical pnp transistor at the left part. p+-contact region 133 formed in the p⁻-type region 131 is formed at the same time as forming of the p-type regions 42 and 43 of the vertical pnp transistor and vertical npn transistor, respectively. An n+-type contact region 134 for the vertical npn transistor is formed at the same time as forming of the n+-type region 46 of the vertical npn transistor.

Since the p⁻-region 131 is formed with a low impurity concentration, the $h_{FE}$ becomes as high as about 1000 even at a normal state. Also, since a low impurity concentration region 132 is formed surrounding the n+-type region 134, there is an advantage that breakdown voltage $v_{EBO}$ against the base region 131 becomes high. In general, when impurity concentration of the base region 131 is low, the impurity concentration gradient around the emitter region 134 becomes steep, and accordingly a surface-hot-electron effect is liable to take place thereby producing surface leakage. However in the configuration of this example, as a result of the low impurity concentration of region 132 surrounding the n+-region 134, the above-mentioned surface-hot-electron effect is substantially weakened.

In this example, the base region 131 of the high $h_{FE}$ transistor and the p⁻-base region 39 of the vertical pnp transistor can be formed in the same step, and further the base region 43 of the vertical npn transistor can be formed at the same time as forming of the emitter region 42 and the contact region 133, therefore no additional step other than forming the n-type region 41 is necessitated to produce the high $h_{FE}$ transistor.

Figure 14:
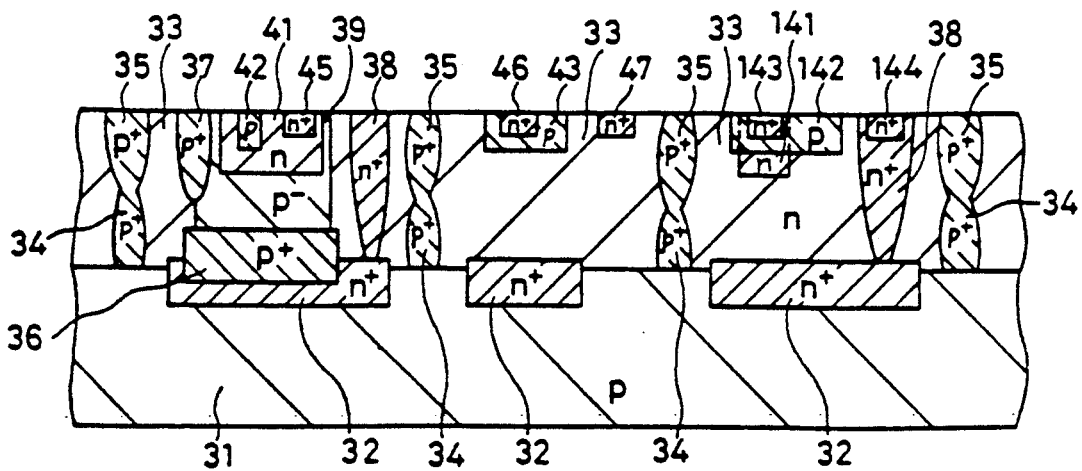
FIG. 14 is a sectional elevation view of a semiconductor IC wherein a vertical pnp transistor, a vertical npn transistor and a high speed vertical npn transistor are monolithically formed on a wafer.

FIG. 14 is a sectional elevation view of another example. In this example, a vertical pnp transistor, a vertical npn transistor and a high speed vertical npn transistor are formed on a monolithic chip wherein the improvement is made in the high speed vertical npn transistor part. The same numerals as those of the foregoing examples designate the corresponding parts. The feature of the improvement is that n-type well region 141 to forms the collector part of the high speed vertical npn transistor and is formed at the same time as forming of the base region 41 of the vertical pnp transistor. A p-type base region 142 is formed at the same time as the emitter region 42 of the vertical pnp transistor and the base region of the vertical npn transistor. An n+-type emitter region 143 of the high speed vertical npn transistor is formed at the same time as forming of the base contact region 45 of the vertical npn transistor and emitter region 46 of the vertical npn transistor. An n+-type collector contact region 144 is formed at the same time as forming of the emitter region 143.

As has been elucidated above, the high speed vertical npn transistor is formed at the same time as the steps of forming other devices of the IC. In this manufacturing of the high speed vertical npn transistor, the n-type collector region 141 is selectively formed directly under the emitter region 143 with impurity concentration higher than that of the n-type collector region 33. Therefore, the high speed vertical npn transistor has higher impurity concentration in its collector region 141 than the vertical npn transistor in the left part so that accordingly the p-type base region 142 can be formed very narrow. That is, the base width can be formed narrow, thereby raising switching speed of the transistor. Furthermore, as a result of providing the high impurity concentration collector region 141, the collector resistance is low, thereby preventing "Kirk" effect, which is lowering of the gain-band width product of the transistor at high current region. That is, the gain-band width product $f_D$ can be increased. When the high impurity concentration collector region 141 is limited to the part directly under the emitter, base-collector junction capacitance can be decreased.

As has been elucidated, the npn transistor having a high impurity concentration collector region 141 is advantageous in improving its high frequency characteristic in comparison with a ordinary vertical npn transistor, and it can be easily combined with the vertical pnp transistor shown in the left part, thereby enabling to forming an IC having high speed npn and pnp transistors monolithically on one chip.

The above-mentioned high impurity concentration n-type region 141 may be formed on all the area directly under the base region 142.

Figure 15:
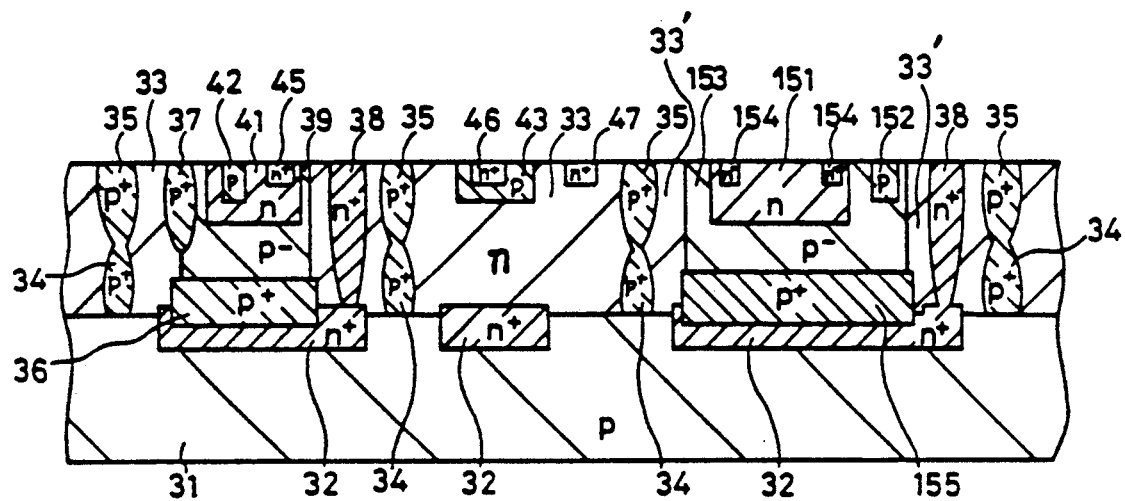
FIG. 15 is a sectional elevation view of a semiconductor IC embodying the present invention wherein a vertical npn transistor and a high resistance device are monolithically formed on a wafer.

FIG. 15 is a sectional elevation view of another example embodying the present invention. The feature of this example is comprising on one monolithic chip a vertical npn transistor, a vertical pnp transistor and a high resistance device. The same numerals as those of FIG. 5 and other examples designate corresponding parts. High resistance part 151 is formed at the same time as forming of the base region 41. A contact region 152 for a low impurity concentration p⁻-island region 153 is formed at the same time as forming the p-type regions 42 and 43. A pair of n⁺-type contact regions 154 are formed at the same time as forming of the emitter region 47 of the vertical npn transistor. The sheet resistance value of the high resistance device utilizing the above-mentioned n-type high resistance region 151 has a larger resistance than a resistor which is hitherto made by utilizing a p-type base region of a vertical npn transistor, and can be made to have a smaller sheet resistance than a case of utilizing the p⁻-diffused region 40. Therefore, their resultant sheet resistance can be between 500 $\Omega/\square$ and 1 k$\Omega/\square$ which is very much appropriate to utilize for high speed logic circuits.

Generally speaking, temperature dependency of the resistance of a diffused region is smaller when the impurity concentration is higher, but in the above-mentioned n region 151 the impurity concentration is relatively high (for example, higher by two digits than that of the epitaxial growth region 33) since the diffusion depth is shallower in comparison with the p⁻-region 153, so that accordingly the high registance device in accordance with the present invention has good temperature dependency.

A p⁺buried region 155 of this example is formed at the same time as forming of the p⁺-type buried region 36 of the vertical pnp transistor in the left part. A p⁻-type region 153 is generally grounded, hence inversely biased to the n-type region 151. On the contrary, when a resistor is formed by using a diffused region of the same type as that of the base region 44 of the vertical npn transistor in the n-type island region 33', the potential of the p⁺-type island region 153 should be opposite to that of the n-type region 33'. In such case if width of the p⁻-type island region 153 at the part under the n-type region is very narrow, a punch-through or any crystal defect or the like will cause undesirable short-circuiting between the n-region 33' and n-region 151. Accordingly by forming the p⁺-type buried diffused region 155 under the p⁻-island region 153, p⁻-type region 153 becomes thick, hence decrease of manufacturing yield due to crystal defect can be much improved.

Figure 16:
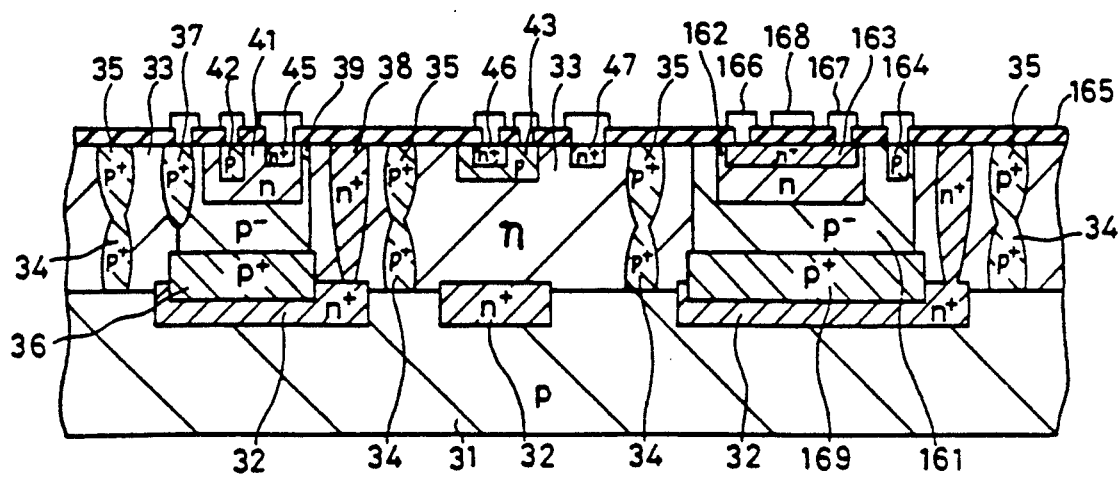
FIG. 16 is a sectional elevation view of a semiconductor IC embodying the present invention wherein a vertical npn transistor and a cross over part are monolithically formed on a wafer.

FIG. 16 is a sectional elevation view of another example embodying the present invention. A feature of this example is that a vertical pnp transistor, a vertical npn transistor and a cross over device are monolithically formed on one chip. The same numerals as those of the foregoing examples designate the corresponding parts. A p⁻-region 161 is formed at the same time as forming of the collector region 39 of the vertical pnp transistor, and in the p⁻-region 161 a cross over wiring is formed as follows.

An n-type well, which is formed at the same time as forming of the base region 41 of the vertical pnp transistor, forms a part of the cross over device. An n⁺-type region 163 is formed at the same time as forming of the emitter region 46 of the vertical npn transistor, and together with the n⁺-type well 162 form the cross over device. A p-type region 164 is for contacting the p⁻-region 161 and is formed when necessary at the same time as forming of the regions 42 and 43. Numeral 165 designates oxide insulation film formed on the wafer, numerals 166 and 167 designate electrodes for the n⁺cross over region 163, and numeral 168 designates electrode such as alminum or the like for crossing the n⁺-region 163.

The cross over device of this example has the following advantages:

1) Since a low impurity concentration n-type region 162 is provided between the p⁻-island region 161 and the cross over region 163, the depth of the cross over region 163 becomes considerably deep, thereby decreasing adverse influence of edge effect, and enabling achievement of a high junction break down voltage.

2) Since the n-region 162 of the low impurity concentration is provided, a parastic junction capacitance at the cross over can be minimized, thereby enabling decrease of signal.

3) Since the p⁻-island region 161 is formed as a deep diffused region, by means of the wide region existing under the cross over region 163, the undesirable influence of punch-through or crystal inperfection becomes small, thereby improving manufacturing yield of the cross over device.

4) When the p⁺-type buried region 169 is provided under the p⁻-island region 161, the same advantage as the previous 3) is further boosted.

Figure 17:
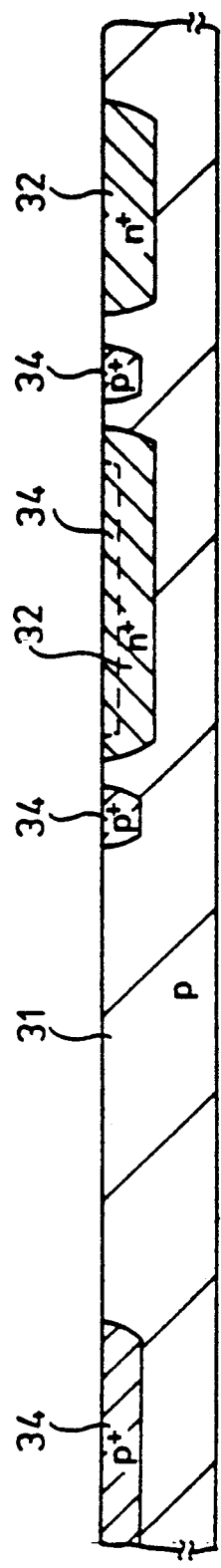
FIG. 17(A), FIG. 17(B) and FIG. 17(C) are sectional elevation views showing manufacturing steps for a semiconductor IC in accordance with the present invention wherein an n-channel MOS transistor, a p-channel MOS transistor, a vertical pnp transistor and an npn transistor are monolithically formed on a wafer.
Figure 17:
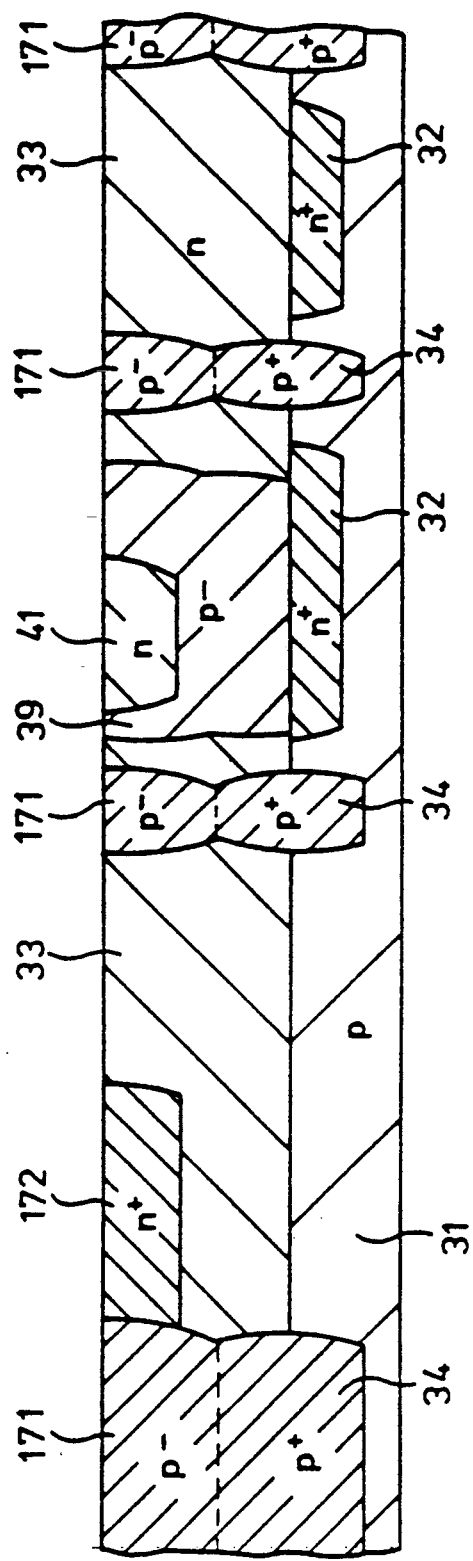
Figure 17C:
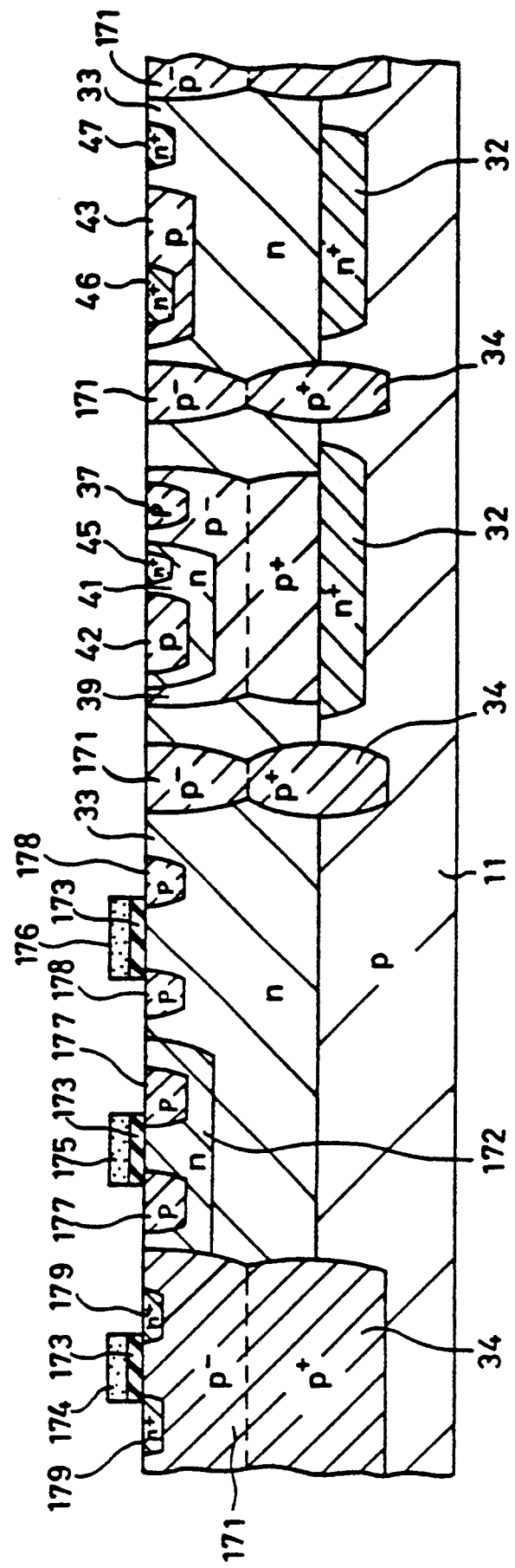

FIG. 17(A), FIG. 17(B) and FIG. 17(C) are sectional elevation views illustrating manufacturing steps of a semiconductor IC comprising a vertical pnp transistor, a vertical npn transistor, a p channel MOS transistor and an n-channel MOS transistor monolithically on one chip.

Firstly, on a surface of p-type substrate 11, as as n-type impurity source is diffused to form n⁺-type buried region 32 as shown in FIG. 17(A) at the part where vertical pnp transistor and vertical npn transistor are to be made. Then, at the parts where n channel MOS transistor and isolation regions and lateral pnp transistor are to be formed, B(boron) as p-type impurity source is diffused or ion-implanted, so as to form a p-type region 34 of sheet resistance of 200-800 $\Omega/\square$, as shown in FIG. 17(A).

Secondly an n-type epitaxial layer 33 having 2-4 μm and specific resistance of 0.6-2 $\Omega$.cm is formed. Then B(boron) as p-type impurity source is ion implanted into the part to form n-channel MOS transistor, isolation regions and a vertical pnp transistor and a heat treatment is carried out, thereby to form n⁺-type well for the n-channel MOS transistor, p⁺-type isolation regions 35, 35 and n⁺-type well 39 for a vertical pnp transistor. Then, P(phosphor) as n-type impurity source is ion implanted at parts to form a first p-channel MOS transistor and base region of a pnp transistor, and a heat treatment carried out. Then, the first and the second impurities are diffused thereby forming p⁺-type regions of 1.3-1.6 μm diffused region depth and 1-3 k$\Omega/\square$ can be formed, thereby forming p-well region 171 where a MOS transistor is to be formed, separation regions 35 and collector region 39 of the pnp transistor are formed. At the same time n-type regions 172 and 41 having sheet resistance of 0.5-2 k$\Omega/\square$ and diffusion depth of 0.8-1 μm are formed in the part for the first p-channel region and the base region of the pnp transistor, as shown in FIG. 17(B).

Then at the part to form the MOS transistor a gate oxide film 173 of 0.06 μm thickness is formed to form polycrystalline silicon gate electrodes 174, 175 and 176. Then source region and drain region of the first and the second p-channel MOS transistor as well as emitter region and collector region of the pnp transistor and the base region of the npn transistor, p+-type regions 177 and 178 of sheet resistance of 100–200 Ω/□ and diffusion depth of 0.6–0.8 μm are formed. Furthermore n+-type regions of sheet resistance of 30–50 Ω/□ and diffusion depth of 0.4 μm are formed at the part of the source region 179 and the drain region 179 of the n-channel MOS transistor, base region 45 of the pnp transistor and emitter region 46 and collector region 47 of the npn transistor, respectively as shown in FIG. 17(C).

In the above-mentioned manufacturing steps, since the substrate of the second p-channel MOS transistor is epitaxial region 33, the $V_T$ value is about $-0.5$ V, while since the substrate of the first p-channel MOS transistor is n-type well region 172 the impurity concentration is high and therefore its $V_T$ value is about $-2$ V. On the other hand, the $V_T$ value of an n-channel MOS transistor is about 1 V. Therefore, it is possible to form two types of p-channel MOS transistors, and desired transistors may be used. Furthermore, since both the p-channel transistor and n-channel transistor are available, it is possible to form a CMOS transistor.

Besides, various resistors of sheet resistances are available, for example as follows:

for n-type resistance region
30–50 Ω/□ and
0.5–2 KΩ/□,
for p-type resistance region
200 Ω/□,
400 Ω/□ and
1 KΩ/□.

As has been elucidated for various examples, according to the present invention MOS transistors of n channel type and p channel type, vertical pnp transistor and vertical npn transistor and resistance region of various kind of sheet resistances can be formed without substantial addition of manufacturing steps. Since two kinds of $V_T$ value of the p-channel MOS transistor are available, freedom of designing the IC is increased.

According to the present invention, free from the conventional shortcomings of the vertical transistor where the base width is determined by mask accuracy and three or four diffusion profiles, only the base width of the bipolar transistors in the IC is determined substantially by diffusion processes of the regions 41 and 42, therefore vertical pnp transistor can be formed with good controllability.

Furthermore, according to the configuration in accordance with the present invention, IIL, high $h_{FE}$ npn transistor, high speed vertical npn transistor, high resistance device, crossover device, p-channel and n-channel MOS transistors, etc. are available within the same manufacturing steps. Therefore, the present invention has good industrial utility.

What is claimed is:

1. A method of fabricating a semiconductor integrated circuit, comprising the steps of:
   forming a n-type semiconductor layer on a p-type semiconductor substrate, said n-type semiconductor layer being divided into first, second, third and fourth regions of n-type;
   forming fifth and sixth regions of low p-type concentration in said first and second regions from upper surfaces of said first and second regions respectively;
   forming seventh and eight regions of p-type in said third region from an upper surface of said third region simultaneously to said forming fifth and sixth regions step;
   forming a ninth region of an n-type in said fifth region from a upper surface of said fifth region;
   forming tenth, eleventh, twelfth, thirteenth and fourteenth regions of p-type in said ninth, sixth, seventh, eight and fourth regions from upper surfaces of said ninth, sixth, seventh, eighth and fourth regions respectively; and
   forming fifteenth, sixteenth and seventeenth regions of n-type in said ninth, eighth and fourteenth regions from upper surfaces of said ninth, eighth and fourteenth regions respectively,
   whereby a pnp type vertical bipolar transistor, resistance device, logic circuit and an npn type vertical bipolar transistor are formed in said first, second, third and fourth regions respectively.

2. A method as in claim 1, wherein said twelfth and thirteenth regions are formed in a projected manner in said third region.

3. A method of fabricating a semiconductor circuit, comprising the steps of:
   (a) forming an n-type semiconductor layer on a p-type semiconductor substrate, said n-type semiconductor layer being divided into first, second and third regions of n-type;
   (b) simultaneously forming fourth and fifth regions of low p-type concentration in said first and second regions as upper surfaces of said first and second regions;
   (c) forming a sixth region of an n-type in said fifth region from an upper surface of said fifth region;
   (d) simultaneously forming seventh and eighth regions of p-type in said sixth and third regions respectively from upper surfaces of said sixth and third regions;
   (e) simultaneously forming ninth, tenth and eleventh regions of n-type in said fourth and eighth regions from upper surfaces of said fourth and eighth regions, respectively, such that said fifth, sixth and seventh regions form a pnp type vertical bipolar transistor and said third, eighth, and eleventh regions form a vertical npn transistor; and
   (f) selectively forming an insulation layer on said fourth region, and forming a polycrystalline silicon gate electrode on said insulation layer such that said fourth, ninth and tenth regions form an n-channel MOS transistor.

4. A method in accordance with claim 3 comprising the further steps of:
   simultaneously to forming said sixth region, forming a twelfth region of an n-type in said first region from an upper surface of said first region;
   simultaneously to forming said seventh and eighth regions, forming thirteenth and fourteenth regions of p-type in said twelfth region;
   simultaneously to forming said insulation layer, selectively forming another insulation layer on said twelfth region; and
   simultaneously to forming said polycrystalline silicon gate electrode, forming a polycrystalline silicon gate electrode on said another insulation layer, such that said twelfth, thirteenth and fourteenth regions form a p-channel MOS transistor.

5. A method of fabricating a semiconductor circuit, comprising the steps of:
   (a) forming an n-type semiconductor layer on a p-type semiconductor substrate, said n-type semiconductor layer being divided into first, second and third regions of n-type;

(b) forming a fourth region of low p-type concentration in said second region as an upper surface of said second region;
(c) forming a fifth region of n-type in said fourth region from an upper surface of said fourth region;
(d) simultaneously forming sixth, seventh, eighth and ninth regions of p-type in said first, fifth and third regions respectively from upper surfaces of said first, fifth and third regions;
(e) forming a tenth region of n-type in said ninth region from an upper surface of said ninth region, whereby said fourth, fifth and eighth regions form a pnp type vertical bipolar transistor, and said third, ninth and tenth regions form an npn type vertical bipolar transistor; and
(f) selectively forming an insulation layer on said first region and forming a polycrystalline silicon gate electrode on said insulation layer whereby said first, sixth and seventh regions form a p-channel MOS transistor.

6. A method in accordance with claim 5 comprising the further steps of:
simultaneously to forming said fifth region, forming an eleventh region of an n-type in said first region from an upper surface of said first region;
simultaneously to forming said sixth, seventh, eighth and ninth regions, forming twelfth and thirteenth regions of p-type in said eleventh region from an upper surface of said eleventh region;
simultaneously to forming said insulation layer, selectively forming another insulation layer on said twelfth region; and
simultaneously to forming said polycrystalline silicon gate electrode, forming a polycrystalline silicon gate electrode on said another insulation layer, whereby said eleventh, twelfth and thirteenth regions form a p-channel MOS transistor.

* * * * *

UNITED STATES PATENT AND TRADEMARK OFFICE
CERTIFICATE OF CORRECTION

PATENT NO. : 5,066,602

DATED : November 19, 1991

INVENTOR(S) : TAKEMOTO, et al.

It is certified that error appears in the above-identified patent and that said Letters Patent is hereby corrected as shown below:

On the title page, item [54], lines 1-2, and Col. 1, lines 1-2, the title should read as follows:

-- METHOD OF MAKING SEMICONDUCTOR IC INCLUDING BIPOLAR TRANSISTORS --

Signed and Sealed this

Twenty-ninth Day of March, 1994

*Attest:*

BRUCE LEHMAN

*Attesting Officer*     *Commissioner of Patents and Trademarks*